(12) United States Patent
Petitgas et al.

(10) Patent No.: US 9,681,537 B2
(45) Date of Patent: Jun. 13, 2017

(54) METHOD FOR PRODUCING A POWER PRINTED CIRCUIT AND POWER PRINTED CIRCUIT OBTAINED BY THIS METHOD

(71) Applicant: Delphi France SAS, Roissy CDG (FR)

(72) Inventors: Jerome Petitgas, Moussy le Neuf (FR); Rene Slezak, Rueil Malmaison (FR)

(73) Assignee: Delphi France SAS (FR)

( * ) Notice: Subject to any disclaimer, the term of this patent is extended or adjusted under 35 U.S.C. 154(b) by 0 days.

(21) Appl. No.: 15/039,764

(22) PCT Filed: Nov. 26, 2014

(86) PCT No.: PCT/EP2014/075615
§ 371 (c)(1),
(2) Date: May 26, 2016

(87) PCT Pub. No.: WO2015/082267
PCT Pub. Date: Jun. 11, 2015

(65) Prior Publication Data
US 2016/0381788 A1 Dec. 29, 2016

(30) Foreign Application Priority Data
Dec. 2, 2013 (FR) ...................... 13 61936

(51) Int. Cl.
*H05K 1/02* (2006.01)
*H02G 5/00* (2006.01)
*H05K 3/32* (2006.01)

(52) U.S. Cl.
CPC .......... *H05K 1/0263* (2013.01); *H05K 3/328* (2013.01); *H05K 2201/10272* (2013.01); *H05K 2203/107* (2013.01)

(58) Field of Classification Search
CPC ................. H05K 1/0263; H05K 3/328; H05K 2201/10272; H05K 2203/107
See application file for complete search history.

(56) References Cited

U.S. PATENT DOCUMENTS 4,907,991 A * 3/1990 Kobayashi ........... H05K 3/4685
29/843
5,530,625 A * 6/1996 VanDerStuyf ...... B60R 16/0238
174/255

(Continued)

FOREIGN PATENT DOCUMENTS

| FR | 2 509 564 A1 | 1/1983 |
| FR | 2 908 587 A1 | 5/2008 |
| JP | H11 18251 A | 1/1999 |

OTHER PUBLICATIONS

International Search Report dated Feb. 10, 2015.

*Primary Examiner* — Hoa C Nguyen
(74) *Attorney, Agent, or Firm* — Lawrence D. Hazelton

(57) ABSTRACT

The invention relates to a process for manufacturing a power circuit board in which, on the one hand, a printed circuit board including an insulating substrate and a conductive track on one of the sides of the substrate, and on the other hand, a bus bar element, are provided. The bus bar element is welded to the conductive track using a laser. In order to make it possible to produce the weld by laser welding, even with a relatively thick bus bar, the welding is carried out in a zone that is thinner relative to the maximum thickness of the bus bar. Thus, a printed circuit board is obtained with a bus bar having a thick zone for conducting high currents and a thinner zone in order to allow the bus bar to be welded to the conductive track by laser welding.

8 Claims, 1 Drawing Sheet

(56) References Cited

U.S. PATENT DOCUMENTS

| | | | | |
|---|---|---|---|---|
| 6,062,903 A | * | 5/2000 | Hawes | H01R 12/57 |
| | | | | 174/261 |
| 6,221,514 B1 | | 4/2001 | Hawes et al. | |
| 6,264,510 B1 | * | 7/2001 | Onizuka | H01R 9/2458 |
| | | | | 439/876 |
| 6,618,272 B2 | * | 9/2003 | Tsuchiya | H01R 9/226 |
| | | | | 174/260 |
| 6,741,453 B1 | * | 5/2004 | Aleardi | H01R 12/515 |
| | | | | 361/640 |
| 7,548,411 B2 | * | 6/2009 | Yamamura | H05K 1/0263 |
| | | | | 361/611 |
| 8,525,043 B2 | | 9/2013 | Delay | |
| 2007/0199926 A1 | * | 8/2007 | Watanabe | H01R 43/0221 |
| | | | | 219/121.64 |
| 2008/0308292 A1 | * | 12/2008 | Okushita | H02G 5/02 |
| | | | | 174/68.2 |
| 2011/0073345 A1 | * | 3/2011 | Sato | H01R 9/24 |
| | | | | 174/50 |

* cited by examiner

METHOD FOR PRODUCING A POWER PRINTED CIRCUIT AND POWER PRINTED CIRCUIT OBTAINED BY THIS METHOD

CROSS-REFERENCE TO RELATED APPLICATION

This application claims the benefit under 35 U.S.C. §371 of published PCT Patent Application Number PCT/EP 2014/075615, filed Nov. 26, 2014 and claims priority to French Patent Application 1361936 filed Dec. 2, 2013, and published as WO2015/082267 Jun. 11, 2015, the entire contents of which is hereby incorporated by reference herein.

TECHNICAL FIELD OF INVENTION

This disclosure generally relates to the field of power circuit boards and to their manufacturing processes.

BACKGROUND OF INVENTION

Power printed circuit boards have many applications in the field of power electronics, and especially in the automotive field. They may for example be used in converters for electrical traction devices.

A printed circuit board generally includes an insulating substrate, for example made of glass epoxy, bearing a conductive layer, for example made of copper, in which the conductive tracks of an electronic or electrical circuit are produced. To pass high currents through these tracks, it may be envisioned to increase the width and/or thickness of these tracks. However, this is sometimes not enough or incompatible with the required size of the circuit. Another solution consists in using a plate or grille of electrically conductive material (the lead frame) or a bus bar connected to the tracks of the printed circuit board. This connection may be made by screwing, brazing, press-fitting, chemical deposition of copper (vias), or welding. A plurality of types of welding are envisioned in document WO 2009/121697 A1, such as soldering with a solder or laser welding.

SUMMARY OF THE INVENTION

One aim of the invention consists in providing a rapid and reliable industrial process allowing bus bars to be welded with as few limitations as possible on their dimensions.

To this end, a process is provided for manufacturing a power electrical circuit in which, on the one hand, an electrically insulating substrate equipped with a track of electrically conductive material (or conductive track) and, on the other hand, a bus bar, are provided. In this process, the bus bar and the conductive track are laser welded at one or more weld spots. A thickness of the bus bar, at the weld spot, smaller than two times the thickness of the conductive track allows, relatively easily, a reliable laser weld to be produced.

This process is certainly advantageous industrially, and economically speaking. Specifically, laser welding technology enables precise, clean, flexible, and economical industrial implementation, with a high production rate. The flexibility of this technology allows it to be adapted to many types and thicknesses of material. For example, the thickness of the conductive track may be smaller than 500 µm.

The implementation of this technology may be facilitated by producing a restriction in the thickness of the bus bar level with the weld spot and/or by welding a first bus bar to the conductive track, the thickness of which at the weld spot is smaller than two times the thickness of the conductive track, and by welding or connecting (before or after the welding of the first bus bar to the conductive track) at least one second bus bar to the first bus bar. For example, in this case, the first bus bar has a thickness smaller than or substantially equal to 400 µm and the second bus bar has a thickness larger than or substantially equal to 400 µm.

According to another aspect, the invention relates to an electrical circuit obtained by this process.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION

Figure 1:
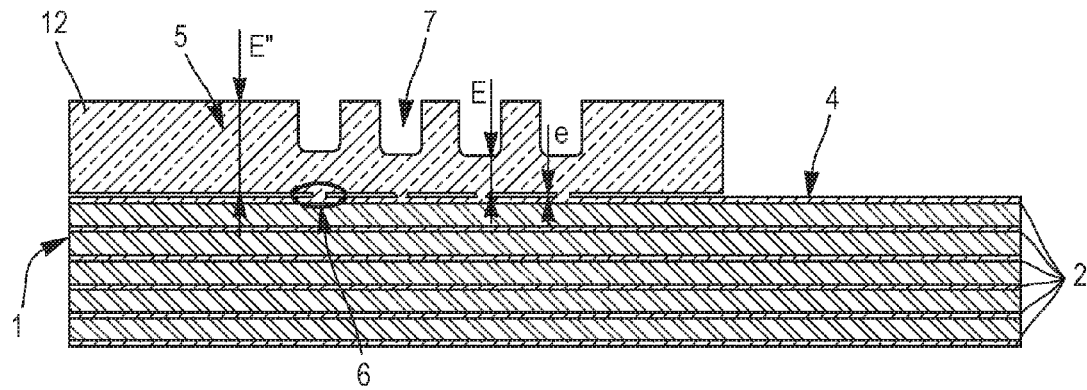
FIG. 1 schematically shows in cross section one embodiment of an electrical circuit according to the invention.

According to a first method of implementation, the process according to the invention consists in laser welding a bus bar to a printed electrical circuit board, level with restrictions produced in the thickness of the bus bar. An exemplary electrical circuit obtained by this process is illustrated in FIG. 1.

Figure 2:
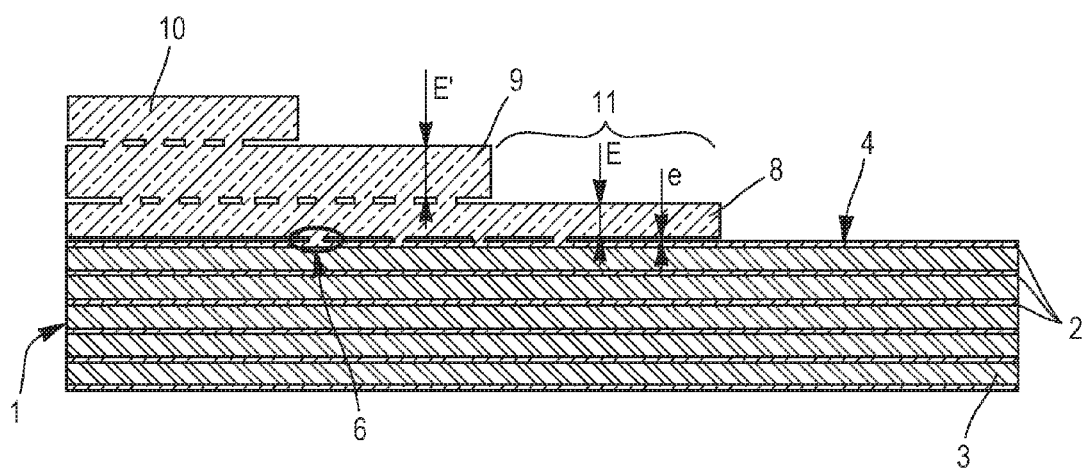
FIG. 2 schematically shows in cross section another embodiment of an electrical circuit according to the invention.

More particularly, according to this method of implementation, a printed circuit board substrate 1 of insulating material is provided. This substrate 1 may include one or more layers 2 of electrically conductive material. Each of these layers rests on an electrically insulating material 3 (FIG. 2). The electrically conductive material of each of the layers of electrically conductive material, and especially the surface layer or conductive track 4, for example consists of copper in the form of sheets the thickness of which is comprised between 75 µm and 105 µm. The insulating material is for example glass epoxy.

A bus bar or bus bar element 5 ("bus bar" for the sake of simplicity) is then provided to be electrically connected to the conductive track 4. This bus bar consists of a material that is a good electrical conductor made of copper or of an aluminum or copper alloy. The thickness of the bus bar is for example 1000 µm.

The electrical joint or connection between the bus bar 5 and the conductive track 4 is made by laser welding. The laser welding is carried out at one or more weld spots 6. Each spot weld 6 is produced level with a restriction 7 in the thickness of the bus bar 5. These thickness restrictions 7 for example take the form of a well or a groove, bringing the thickness of the bus bar 5, at the bottom of each restriction 7, to a thickness close to that of the conductive track 4. The ratio of one of these thicknesses relative to the other is advantageously smaller than two. For example, the thickness E of the bus bar 5 at the bottom of the restriction has at most two times the thickness e of the conductive track 4.

The restrictions 7 may be produced by drawing, etching, etc.

According to one variant (not illustrated) the one or more spot welds are produced in zones of smaller thickness (in addition or instead of the restrictions described above) such as bevels.

Thus, two technologies have been mixed: that of low-power electrical/electronic circuits with that of high-power circuits (bus bars). Thus, a printed circuit board is obtained with a bus bar 5 with a thick zone 12, of thickness E" larger than the thickness E, for conducting high currents, and thinner zones level with the restrictions 7, allowing the bus bar 5 to be laser welded to the conductive track 4.

According to a second method of implementation, the process according to the invention consists in laser welding a bus bar to a printed electrical circuit board, then in electrically connecting this bus bar to one or more other bus bars. An exemplary electrical circuit obtained by this process is illustrated in FIG. 2.

As for the first method of implementation, a substrate 1 of electrically insulating material, with a surface layer or conductive track 4 of electrically conductive material, is provided. One or more other layers 2 of electrically conductive material may be inserted in the thickness of the substrate 1. A first bus bar 8 is also provided which is welded to the conductive track 4. The nature of the constituent materials of the substrate 1, the layers 2, 4 of electrically conductive material, of the electrically insulating material 3 and of the bus bar 5, respectively, is chosen from those mentioned with respect to the first method of implementation of the process according to the invention. The first bus bar 8 is relatively thin. For example, this thickness is 400 μm for a conductive track 4 of 200 μm thickness. The thickness E of the first bus bar 8 at the weld spot 6 is smaller than or equal to two times the thickness e of the track 4. Laser welding is carried out at one or more weld spots 6. A thicker second bus bar 9 is then connected to the first bus bar 8. The second bus bar 9 for example has a thickness E' larger than 400 μm, for example 600 μm, or even 800 μm or more. The first and second bus bars 8, 8 may be electrically connected by (optionally laser) welding. The fact that there is no fragile insulating material directly subjacent and/or the fact that there is already a relatively thick layer of electrically and thermally conductive material (first bus bar) present to evacuate the energy optionally allows higher energies and/or temperatures to be used.

Optionally, a third, fourth, etc. bus bar 10 may similarly be electrically connected to the bus bars already connected to the printed circuit board formed from the substrate 1 and the conductive track 4.

Optionally, the bus bars are stacked and fastened to one another in prior steps and a zone 11 of smaller thickness is provided in order to allow the laser welding to the conductive track 4 to be carried out.

While this invention has been described in terms of the preferred embodiments thereof, it is not intended to be so limited, but rather only to the extent set forth in the claims that follow.

The invention claimed is:

1. An electrical circuit comprising an electrically insulating substrate equipped with a track of electrically conductive material, and a bus bar that is welded by laser welding, at at least one weld spot, to the track of electrically conductive material, wherein a restriction-thickness of the bus bar at the weld spot is smaller than two times the track-thickness of the track of electrically conductive material, and the bus bar includes at least one restriction in its thickness aligned with the weld spot.

2. The electrical circuit as claimed in claim 1, in which the track-thickness of the track of electrically conductive material is smaller than 500 μm.

3. The electrical circuit as claimed in claim 1, including a first bus bar welded, at at least one weld spot, to the track of electrically conductive material, and in which at least one second bus bar is connected or welded to the first bus bar.

4. The electrical circuit as claimed in claim 3, in which the first bus bar has a restriction-thickness smaller than or equal to 400 μm and the second bus bar has a bar-thickness larger than or equal to 400 μm.

5. A process for manufacturing an electrical circuit in which an electrically insulating substrate equipped with a track of electrically conductive material, and a bus bar are provided and in which, at at least one weld spot, the bus bar is welded by laser welding to the track of electrically conductive material, wherein a restriction-thickness of the bus bar at the weld spot is smaller than two times a track-thickness of the track of electrically conductive material, and a restriction is produced in the thickness of the bus bar aligned with the weld spot.

6. The process as claimed in claim 5, in which the track-thickness of the track of electrically conductive material is smaller than 500 μm.

7. The process as claimed in claim 5, in which a first bus bar is welded to the track of electrically conductive material, the restriction-thickness of which, at the weld spot, is smaller than two times the track-thickness of the track of electrically conductive material, and at least one second bus bar is welded or connected to the first bus bar.

8. The process as claimed in claim 7, in which the first bus bar has a restriction-thickness smaller than or equal to 400 μm and the second bus bar has a bar-thickness larger than or equal to 400 μm.

* * * * *